United States Patent

Shalom et al.

[19]

[11] Patent Number: 6,166,601
[45] Date of Patent: Dec. 26, 2000

[54] SUPER-LINEAR MULTI-CARRIER POWER AMPLIFIER

[75] Inventors: Yuval Shalom, Givatayim; Danny Arison, Tel Aviv; Kalman Kaufman, Ramat Hasharon, all of Israel

[73] Assignee: WiseBand Communications Ltd., Israel

[21] Appl. No.: 09/226,709

[22] Filed: Jan. 7, 1999

[51] Int. Cl.[7] .................................................. H03F 1/26
[52] U.S. Cl. ........................................ 330/151; 330/149
[58] Field of Search .................................... 330/149, 151

[56] References Cited

U.S. PATENT DOCUMENTS

| | | | |
|---|---|---|---|
| 4,389,618 | 6/1983 | Bauman | 330/149 |
| 4,412,185 | 10/1983 | Gerard | 330/149 |
| 4,560,945 | 12/1985 | Olver | 330/149 |
| 4,885,551 | 12/1989 | Myer | 330/149 |
| 5,077,532 | 12/1991 | Obermann et al. | 330/149 |
| 5,157,345 | 10/1992 | Kenington et al. | 330/149 |
| 5,300,894 | 4/1994 | Myer et al. | 330/129 |
| 5,302,914 | 4/1994 | Arntz et al. | 330/129 |
| 5,334,946 | 8/1994 | Kenington et al. | 330/149 |
| 5,339,054 | 8/1994 | Taguchi | 332/100 |
| 5,349,300 | 9/1994 | Matz et al. | 330/129 |
| 5,386,198 | 1/1995 | Ripstrand et al. | 330/52 |
| 5,455,537 | 10/1995 | Larkin et al. | 330/52 |
| 5,485,120 | 1/1996 | Anvari | 330/151 |
| 5,574,400 | 11/1996 | Fukuchi | 330/151 |
| 5,929,704 | 7/1999 | Proctor, Jr. et al. | 330/149 |
| 5,977,825 | 11/1999 | Mueck | 330/151 |
| 6,011,434 | 1/2000 | Sakai | 330/151 |

FOREIGN PATENT DOCUMENTS

| | | |
|---|---|---|
| 2244881 | 5/1993 | United Kingdom . |
| 2254505 | 5/1993 | United Kingdom . |
| WO 94/14238 | 6/1994 | WIPO ............................... H03F 1/32 |
| WO 98/12800 | 3/1998 | WIPO ............................... H03F 1/26 |

OTHER PUBLICATIONS

Repeatered Line, E.H. Angell et al., The Bell System Technical Journal Dec. 1974, vol. 53, No. 10, pp. 1935–1985.

Time–Frequency Analysis Using Time–Dependent ARMA Models, Y. Grenier, IEEE, 1984, pp. 41B.5.1–41B.5.4.

Signal Estimation Using Modified Wigner Distributions, G.F. Boudreaux–Bartels et al., Department of Electrical Engineering, Rice University, IEEE, 1984, pp. 22.3.1–22.3.4.

An Adaptive Kalman Equalizer: Structure and Performance, Bernard Mulgrew et al., Sactions on Acoustics, Speech, and Signal Processing, Dec. 1987, vol. ASSP–35, No. 12, pp. 1727–1735.

Linearity Requirements for a GSM Base Station Power Amplifier, S. Pike et al., The Institution of Electrical Engineers, 1994, IEE, Savoy Place, London, UK.

Effect of Delay Mismatch on a Feedforward Amplifier, K.J. Parsons, IEE Proc.–Circuits Devices Syst., Apr. 1994, vol. 141, No. 2, pp. 140–144.

(List continued on next page.)

*Primary Examiner*—Robert Pascal
*Assistant Examiner*—Khanh Van Nguyen
*Attorney, Agent, or Firm*—Limbach & Limbach LLP

[57] ABSTRACT

A super-linear feedforward amplifier, for amplifying radio-frequency input signals produced in one or more frequency channels over an input band, includes a radio-frequency power amplifier, which amplifies the signals. A signal cancellation circuit loop generates an error signal responsive to distortion products in the amplified signals. A digital correction block digitally equalizes the input signals responsive to a transfer function of the amplifier, whereby the input signals are substantially canceled out of the error signal over the entire input band. An error cancellation circuit loop subtracts the error signal from the amplified signals to generate a linearized output signal.

35 Claims, 6 Drawing Sheets

OTHER PUBLICATIONS

Characterization of Peak Factor Effects and Intermodulation Distortion (IMD) in Multi-carrier Communications Systems, Thomas D. Marra, RDL, Inc., IEEE Proc.–Circuits Devices Syst., vol. 141, No. 2, Apr. 1994, pp. 207–212.

The Efficiency of a Feedforward Amplifier with Delay Loss, K. J. Parsons et al., IEEE Transactions on Vehicular Technology, May 1994, vol. 43, No. 2., pp. 407–412.

Power Rating of Multi-Channel Linear Amplifiers, D.W. Bennett et al., Mobile and Personal Communications, Dec. 13–15, 1993, Conference Publication No. 387, IEE, pp. 236–30.

RF Linear Amplifier Design, P.B. Kenington et al., Centre for Communications Research, University of Bristol, U.K., RF Expo West, San Jose, CA, Mar. 22–24, 1994, pp. 223–231.

A Highly-Efficient Linear Amplifier for Satellite and Cellular Applications, K.J. Parsons, Centre for Communications Research, University of Bristol, U.K., IEEE 1995, pp. 203–207.

Power-Amplification Techniques for Linear TDMA Base Stations, R.J. Wilkinson et al., Centre for Communications Research, University of Bristol, U.K., Globe Com'92, Global Telecommunications Conf., Orlando, Florida, Dec. 1992, pp. 74–78.

Broadband Linear Amplifier Design for a PCN Base-Station, P.B. Kenington et al., Centre for Communications Research, University of Bristol, U.K., 1991, IEEE, pp. 155–160.

TWTA Linearization, Allen Katz, Microwave Journal, Apr. 1996, pp. 78–90.

Adaptation Behavior of a Feedforward Amplifier Linearizer, James K. Cavers, IEEE Transactions on Vehicular Technology, vol. 44, No. 1, Feb. 1995, pp. 31–40.

Convergence Behaviour of an Adaptive Feedforward Linearizer, James K. Cavers, School of Engineering Science, Canada, 1994, IEEE, pp. 499–503.

Efficient Linearisation of RF Power Amplifiers for Wideband Applications, K.J. Parsons et al., Amplifiers and Transmitters, London, U.K., Apr. 1994, IEE Colloquium Digest 1994, pp. 7/1–7/6.

Extremely Low-Distortion Mulit-Carrier Amplifier—Self-Adjusting Feed-Forward (SAFF) Amplifier—, Shoichi Narahashi et al., NTT Radio Communication Systems Laboratories, Japan, 1991 IEEE, pp. 1485–1490.

Evaluation and Correction of Time Dependent Amplifier Non-Linearity, Allen Katz et al., Lockheed Martin Astro Space and Trenton State College, 1996 IEEE MTT-S Digest, pp. 839–842.

Block Coding Scheme for Reduction of Peak to Mean Envelope Power Ratio of Multicarrier Transmission Schemes, A.E. Jones et al., Electronics Letters Dec. 8, 1994, vol. 30, No. 25, pp. 2098–2099.

Performance of Amplitude Limited Multitone Signals, R. O'Neill et al., University of Leeds, U.K., 1994 IEEE, pp. 1675–1679.

Peak Factor in Orthogonal Multicarrier Modulation With Variable Levels, D. Wulich, Electonics Letters Sep. 26, 1996, vol. 32, No. 20, pp. 1859–1861.

Synthesis of Low–Crest Waveforms for Multicarrier CDMA System, T.F. Ho et al., The Chinese University of Hong Kong, 1995 IEEE, pp. 131–135.

A High–Gain Cell Enhancer, W.T. Slingsby et al., Centre for Communications Research, University of Bristol, U.K., 1992 IEEE, pp. 756–758.

Effective Linearizaton of Broadband Amplifiers by Use of Cascade Compensation Between the Amplifier Stages, Hermann Ens, University of Defence Munich, Institute for Communication, 1989 IEEE, pp. 2080–2083.

Application of Linearised Amplifiers in Adaptive Antennas, Hongxi Xue et al., IEEE MTT–S 1995 International Topical Symposium, pp. 51–56.

The Effect of Data Modulation Format on Intermodulation Power in Nonlinear Amplifiers, James K. Cavers, School of Engineering Science, Simon Fraser University, Canada, IEEE 44th Vehicular Technology Conference, Stockholm, Jun. 8–10, 1994, vol. 1, pp. 489–493.

Parallel Amplitude and Phase Predistortion for RF Power Amplifier Linearization, Aldo N. D'Andrea et al., University of Pisa, Italy, 1995 IEEE, pp. 198–202.

Linear Transmitter Design Using High Efficiency Class E Power Amplifier, Tirdad Sowlati et al., University of Toronto, 1995 IEEE, pp. 1233–1237.

An Adaptive Direct Conversion Transmitter, D. Hilborn et al., University of Bombay, IEEE Vehicular Technology Society 42nd VTS Conf., Denver, Co., May 1992.

Memory Controlled Feedforward Lineariser Suitable or MMIC Implementation, S. Kumar et al., IEEE Proceedings–H, vol. 138, No. 1, Feb. 1991, pp. 9–12.

Cartesian Feedback Amplifier with Soft Landing, Y. Ohishi et al., Fujitsu Laboratories Ltd., Japan, International Symposium on Personal Indoor and Mobile Radio Communications, Boston, Mass, Oct. 1992, pp. 402–406.

Efficiency of Feedforward Amplifiers, P.B. Kenington, IEEE Proceedings–G., vol. 139, No. 5, Oct. 1992, pp. 591–593.

Power Amplifier Linearization Using MMICs, Surlnder Kumar, Microwave Journal, Apr. 1992, pp. 96–104.

Simple Procedure for Optimum Linearisation of Amplifiers in Multicarrier Applications, M. Burgos–Garcia et al., Electronics Letter, Jan. 20, 1994, vol. 30, No. 2, pp. 114–115.

ADCs and DACs Send Signals Between Realms, Jack Browne (Associate Publisher/Editor), Buyer's Guide, Microwaves and RF, Feb. 1997, pp. 103–108.

Correction Modules for Reedforward Applications, Microwave Journal, Aug. 1996, pp. 142 and 144.

An Amplitude and Phase Linearizing Technique for Linear Power Amplifiers, Masatoshi Nakayama et al, Microwave Journal, Mar. 1996, pp. 96–104.

A Linearized MMDS Solid–State Amplifier, The Microwave Journal, Euro–Global Edition, Jan. 1997, vol. 40, No. 1, 2 pages.

Feedforward Correction Reduces IMD in Broadcast Amplifiers, G.S.V.S. Mallikarjuna Rao et al., Microwaves & RF, Jun. 1998.

Two–Tone Linearity in a 900 MHz Silicon Bipolar Class AB Amplifier, Korné Vennema, Microwave Journal, Feb. 1996, pp. 88–93.

Optimal Feedforward Linearization System Design, E. Eid et al., Microwave Journal, Nov. 1995, pp. 79–86.

MCPA Strategy for Emerging Technologies, Dave Bolan et al., Cellular Business, Jul. 1995.

A control System for a Feedforward Amplifier, David Wills, Microwave Journal, Apr. 1998, pp. 22–34.

SUPER-LINEAR MULTI-CARRIER POWER AMPLIFIER

FIELD OF THE INVENTION

The present invention relates generally to high-performance amplifiers for communications applications, and specifically to broadband, multi-carrier feedforward amplifiers.

BACKGROUND OF THE INVENTION

Modern cellular, satellite and other communications systems use multiple channels, closely spaced over an assigned communications band. In order to avoid inter-channel interference, it is essential that RF power amplifiers that are used in base station transmitters be highly linear. Non-linearities can cause signals from one channel to spread spectrally into neighboring channels, causing unacceptable interference. For this reason, cellular communications standards commonly require that inter-channel rejection be at least 60–75 dBc, i.e., that signals spreading into any given channel from other channels be at least 60–75 dB below the channel carrier. The larger the number of carriers to be amplified by the power amplifier, the more difficult it generally becomes to maintain adequate amplifier linearity.

FIG. 1 is a schematic block diagram showing the design of a base station transmitter 20, as is commonly used in cellular communications, based on a plurality of single-channel RF power amplifiers 30, 32. . . , 34. Signals are generated for transmission in a plurality of frequency channels by respective transceivers 22, 24. . . , 26. For cellular bands in the 800–900 MHz range, the typical bandwidth of a single channel can be anywhere from 10 kHz to 1.25 MHz. The signal in each channel is amplified by the respective amplifier 30, 32. . . , 34, so that frequency spreading and intermodulation between channels are avoided. The amplified signals are typically combined by a cavity combiner 36 and transmitted via an antenna 38. The use of single-channel power amplifiers 30, 32. . . , 34 enables transmitter 20 to satisfy the inter-channel rejection requirements of cellular systems. But the use of multiple power amplifiers and power combiner 36 substantially increases the cost and complexity and reduces the reliability, efficiency and operational flexibility of the transmitter. Thus, there would be a clear economic and technical advantage in using a single wideband power amplifier in place of the array of single-channel amplifiers and combining network shown in FIG. 1.

Various solutions have been proposed for improving linearity and reducing inter-channel effects in multi-carrier RF amplifiers. One such solution is the feedforward amplifier circuit, in which a portion of the signals at the input to the amplifier are fed forward and, following suitable amplitude and phase adjustment, are subtracted from the amplifier output to generate an error signal proportional to distortion components of the output. The portion of the circuit that generates the error signal is known as the signal-cancellation loop. The error signal is then amplified, phase-adjusted and subtracted from the amplifier output to give a corrected RF output with reduced distortion effects. This portion of the circuit is known as the error-cancellation loop.

Typically, the amplitude and phase adjustments in the signal- and error-cancellation loops are set by injecting a "pilot tone" and then varying the amplitude and phase until a desired output is obtained. The adjustments made in this manner, however, are inherently narrowband and give optimal amplifier performance only at a certain frequency.

U.S. Pat. No. 4,412,185, which is incorporated herein by reference, describes a feedforward amplifier using such an approach. A reference signal is injected into a main amplifying element in the feedforward amplifier so that it appears at an output terminal of the amplifier as through it were an amplifier-induced distortion. The characteristics of the amplifier are adaptively modified to eliminate the reference signal from the output signal.

A different approach that has been proposed to improve linearity of feedforward amplifiers is non-linear predistortion of the amplifier input, to compensate for the non-linear distortion introduced by the power amplifier itself. Because the amplifier characteristics change over time and in response to changing operating conditions, the predistortion is often applied adaptively. Typically, feedback from the amplifier output is used to control predistortion parameters.

FIG. 2 is a block diagram illustrating a multi-channel feedforward amplifier 40, as is known in the art, using pre-adjustment of the input signals to reduce distortion. Amplifier 40 is described in U.S. Pat. No. 5,157,345, which is incorporated herein by reference. Signals from multiple transceivers 22, 24. . . , 26 are fed to an input phase adjustment block 44 and gain adjustment block 48, which include a separate, respective phase adjuster 46 and variable gain component 50 for gain adjustment of each channel. The adjusted inputs are then summed together after adjustment by an adder 52 and are fed to a wideband power amplifier 54.

A portion of the input at each channel is split off by an input splitter 42, and these portions are summed by an adder 64. Following a suitable delay 68 (which includes phase negation of the signals), the summed input signals are subtracted at an adder 70 from a portion of the output of power amplifier 54, which is split off by a directional coupler 56, thus generating the feedforward error signal. The error signal is delayed by a delay 72, adjusted in phase and gain by phase adjuster 74 and variable gain component 76, and amplified by an amplifier 78. Following a delay 58, the output of power amplifier 54 is combined with the error signal by a directional coupler 82 to generate the amplified and corrected output signal.

Each of phase adjusters 46 and 74 and variable gain components 50 and 76 is adaptively controlled by a respective feedback network to suppress the distortion interference in the output signal. To control adjuster 74 and gain component 76 in the error correction loop, a single feedback network 86 receives sampled error signals from a directional coupler 80 and sampled output signals from a directional coupler 84 and generates control signals accordingly. For the multiple adjusters 46 and gain components 50 in blocks 44 and 48, however, a separate feedback network 88, 90. . . , 92 is required for each of the transceiver channels. As noted in the above-mentioned U.S. Pat. No. 5,157,345, there may be as many as 100 such channels transmitted by a typical cellular base station, and a comparable number of feedback networks. Each of networks 88, 90. . . , 92 receives a respective sampled input signal, split off by a directional coupler 62 in splitter block 60, together with sampled error signals from coupler 80, via a splitter 87. Each of these networks outputs control signals to the phase adjuster 46 and gain component 50 at the input of the respective channel.

Thus, feedforward amplifier 40 attempts to overcome the limitations of narrowband feedforward amplifiers by correcting each of the input signals separately, effectively providing a separate signal cancellation loop for each input channel. A similar approach is described in U.S. Pat. No. 4,560,945.

Other possible approaches to multi-channel linearization are described in U.S. Pat. No. 5,077,532, in which a microprocessor adjusts the feedforward circuits based on spectral analysis of the amplifier output signal; and in U.S. Pat. No. 5,455,537, in which a broadband pilot signal is used. An article by Parsons, et al., entitled "A Highly-Efficient Linear Amplifier for Satellite and Cellular Applications," in *IEEE Globecom*, Vol. 1 (December 1995), pp. 203–207, suggests combining analog predistortion with feedforward linearization. PCT patent publication WO98/12800 describes an RF power amplifier that combines feedforward correction with adaptive digital predistortion. An RF signal output by the power amplifier is down-converted and sampled, and the average power of this signal is used as an input to a look-up table, so as to vary the values of complex gain applied to the input signal to the amplifier and to a feedforward error signal.

SUMMARY OF THE INVENTION

It is an object of some aspects of the present invention to provide a wideband multi-carrier amplifier with improved linearity.

It is a further object of some aspects of the present invention to provide a highly linear wideband multi-carrier amplifier at reduced cost relative to amplifiers known in the art.

It is still a further object of some aspects of the present invention to provide a wideband multi-carrier RF linear amplifier that is compatible with commonly-available base station transceivers.

In preferred embodiments of the present invention, a multi-carrier feedforward amplifier comprises a main radio frequency (RF) power amplifier, coupled to signal cancellation and error cancellation loops. A digital correction block in the signal cancellation loop receives signals from one or more transceivers for input to the power amplifier and digitally equalizes the signals to correct for gain and phase distortions introduced by the power amplifier, as well as other elements of the feedforward amplifier. Preferably, the digital correction block is controlled adaptively using feedback signals received from the signal and/or error cancellation loops, so that the equalization compensates in real time for amplitude and phase distortions in a transfer function of the feedforward amplifier. As a result, the feedforward amplifier provides highly-linear amplification over a broad frequency band, with strong suppression of intermodulation products.

In some preferred embodiments of the present invention, RF input signals on a plurality of carrier frequencies, typically originating from a plurality of respective transceivers, are summed and input to the feedforward amplifier. The digital correction block receives and digitally equalizes the RF signals before they are input to the power amplifier. Preferably, the RF signals are down-converted to an intermediate frequency and are then A/D converted to a stream of digital samples. A finite-impulse-response (FIR) filter convolves the stream of samples with a vector of coefficients, calculated so as to equalize the amplitude and phase distortions in the transfer function of the main power amplifier, as well as by other components in the signal cancellation loop. The feedback signals received from the signal and/or error cancellation loops are preferably down-converted and digitized for use by a digital signal processor (DSP) in adaptively calculating the filter coefficients. After filtering, the signals are converted back to analog form and up-converted to the RF frequency for input to the power amplifier.

By using high-speed digital equalization, the feedforward amplifier of the present invention achieves superior wideband performance to feedforward amplifiers known in the art. A single digital correction block effectively corrects for signal distortions over the entire operating band of the amplifier. Furthermore, because it is capable of accepting multi-carrier RF input, summed together from multiple transceivers, the feedforward amplifier of the present invention can be substituted in base station transmitters in place of the multiple single-channel RF amplifiers that are currently in common use, without requiring substantial changes other base station components.

There is therefore provided, in accordance with a preferred embodiment of the present invention, a super-linear feedforward amplifier, for amplifying radio-frequency input signals produced in one or more frequency channels over an input band, including:

a radio-frequency power amplifier, which amplifies the signals;

a signal cancellation circuit loop, which generates an error signal responsive to distortion products in the amplified signals;

a digital correction block, which digitally equalizes the input signals responsive to a transfer function of the amplifier, whereby the input signals are substantially canceled out of the error signal over the entire input band; and an error cancellation circuit loop, which subtracts the error signal from the amplified signals to generate a linearized output signal.

Preferably, the digital correction block equalizes an amplitude and phase response of the amplifier over substantially the entire input band and corrects linear distortions in the amplified signals.

Further preferably, the input signals include a plurality of signals in different, respective channels, which are summed together for input to the amplifier.

Preferably, the digital correction block receives feedback signals sampled at one or more points in at least one of the signal and error cancellation loops and processes the feedback signals to determine characteristics of the transfer function.

Most preferably, the digital correction block includes a digital signal processor, which calculates a correlation of the feedback signals and determines the characteristics of the transfer function based on the correlation. Preferably, the digital signal processor finds eigenvalues and eigenvectors of a matrix based on the correlation, and applies the eigenvalues and eigenvectors to generate processing coefficients for use in equalizing the signals. Further preferably, the digital correction block includes a receiver for receiving and digitizing the feedback signals, the receiver having a transfer function, and wherein the digital signal processor calibrates the receiver responsive to the transfer function thereof before receiving and processing the feedback signals.

Preferably, the feedback signals include samples of the amplified signal output by the power amplifier and of a delayed input signal in the signal cancellation loop, and the digital correction block adaptively controls operation of the amplifier substantially without passing a pilot signal therethrough.

In a preferred embodiment, the amplifier includes a down-converter, which converts the input signals from the radio frequency to an intermediate frequency for input to the digital correction block, and an up-converter, which converts the equalized signals to the radio frequency for amplification thereof. Preferably, the equalized signals from the up-converter are input to the power amplifier.

There is further provided, in accordance with a preferred embodiment of the present invention, a super-linear feedforward amplifier, for amplifying radio-frequency input signals produced in one or more frequency channels over an input band, including:

a radio-frequency power amplifier, which amplifies the signals;

a signal cancellation circuit loop, which generates an error signal responsive to distortion products in the amplified signals;

a time-domain correction block, which processes the input signals in the time domain, responsive to a transfer function of the amplifier, such that the input signals are substantially canceled out of the error signal over the entire input band; and an error cancellation circuit loop, which subtracts the error signal from the amplified signals to generate a linearized output signal.

Preferably, the time-domain correction block equalizes the input signals responsive to the transfer function.

In a preferred embodiment, the correction block includes:

an analog-to-digital converter, which digitizes the input signals to generate a stream of digital samples;

a finite impulse response filter, which convolves the digital samples with a vector of coefficients determined responsive to the transfer function; and a digital-to-analog converter, which converts the equalized signals to analog form for output from the block.

There is also provided, in accordance with a preferred embodiment of the present invention, a method for feedforward amplification of radio frequency signals input from one or more frequency channels over an input band, including:

providing a power amplifier and associated circuitry having an amplitude and phase transfer function;

determining a characteristic of the transfer function of the amplifier and the associated circuitry;

equalizing the signals responsive to the characteristic;

amplifying the signals using the amplifier;

generating an error signal responsive to distortion in the amplified signals; and subtracting the error signal from the amplified signals to generate a linearized output signal in which the distortion is reduced.

Preferably, equalizing the signals includes equalizing an amplitude and phase response of the amplifier over substantially the entire input band, and processing the input signals to compensate for linear distortions in the amplified signals introduced by the power amplifier and associated circuitry. Preferably, amplifying the signals includes amplifying the processed signals.

Further preferably, the method includes summing a plurality of signals in different, respective channels for input to the amplifier.

Preferably, determining the characteristic includes receiving and processing feedback signals sampled at one or more points in circuitry associated with the amplifier. Most preferably, processing the feedback signals includes calculating a correlation of the feedback signals and determining the characteristic of the transfer function based on the correlation.

Preferably, processing the feedback signals includes finding eigenvalues and eigenvectors of a matrix based on a vector indicative of the correlation and generating processing coefficients for use in equalizing the signals based on the eigenvalues and eigenvectors. Further preferably, equalizing the signals includes convolving the signals with a vector of the processing coefficients. Preferably, generating the coefficients includes calculating coefficients dependent on the eigenvalues, wherein calculating the coefficients includes eliminating eigenvalues that are below a given threshold.

In a preferred embodiment, calculating the correlation includes:

determining an initial estimate of the correlation based on feedback signals received during a first time slot;

receiving additional feedback signals during a second, subsequent time slot; and iteratively updating the initial estimate of the correlation based on the additional feedback signals.

Preferably, calculating the correlation includes deriving a signal parameter from the feedback signals and, responsive to a substantial change in the parameter, determining a new estimate of the correlation vector instead of iteratively updating the initial estimate.

In a preferred embodiment, receiving the feedback signals includes using signal receivers having an amplitude and phase transfer function, and processing the signals includes calibrating the receivers to determine calibration coefficients responsive to the transfer function thereof and applying the calibration coefficients to the signals.

Preferably, receiving the feedback signals includes sampling the amplified signals and sampling the input signals following a delay thereof.

In a preferred embodiment, the method includes down-converting the input signals from the radio frequency to an intermediate frequency for equalization thereof, and up-converting the equalized signals to the radio frequency. Preferably, amplifying the signals including amplifying the equalized signals following up-conversion thereof.

Preferably, equalizing the signals includes processing the input signals in the time domain.

In a preferred embodiment equalizing the signals includes:

digitizing the input signals to generate a stream of digital samples;

processing the digital samples responsive to the transfer function; and converting the equalized signals to analog form for output from the block.

Preferably, processing the digital samples comprises convolving the digital samples with a vector of coefficients determined responsive to the transfer function.

Preferably, generating the error signal includes controlling the circuitry substantially without passing a pilot signal therethrough.

The present invention will be more fully understood from the following detailed description of the preferred embodiments thereof, taken together with the drawings in which:

DETAILED DESCRIPTION OF PREFERRED EMBODIMENTS

Figure 1:
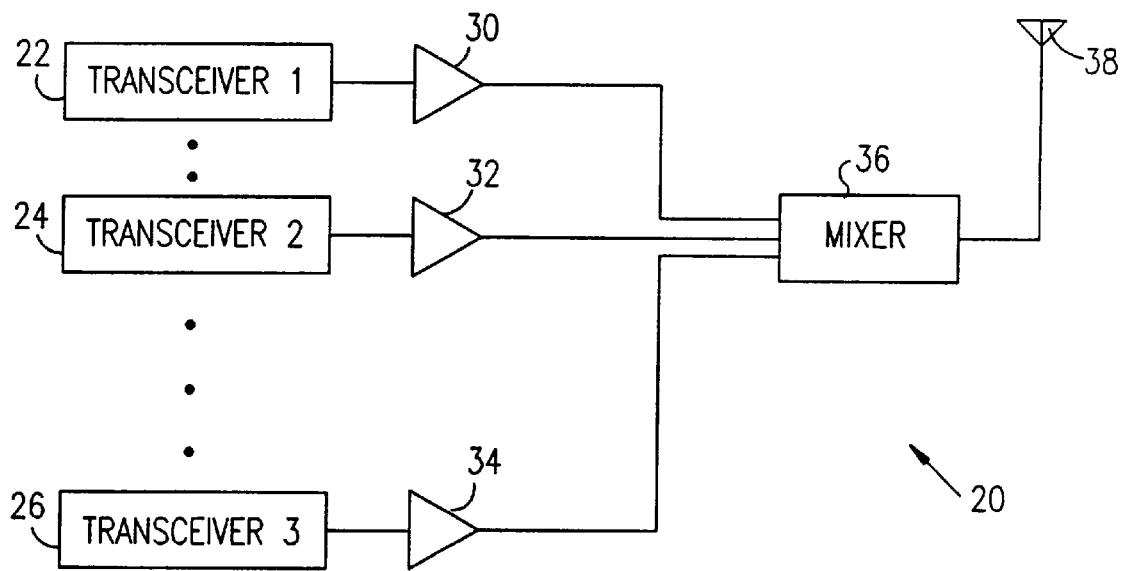
FIG. 1 is a schematic block diagram illustrating a base station transmitter, as is known in the art.
Figure 2:
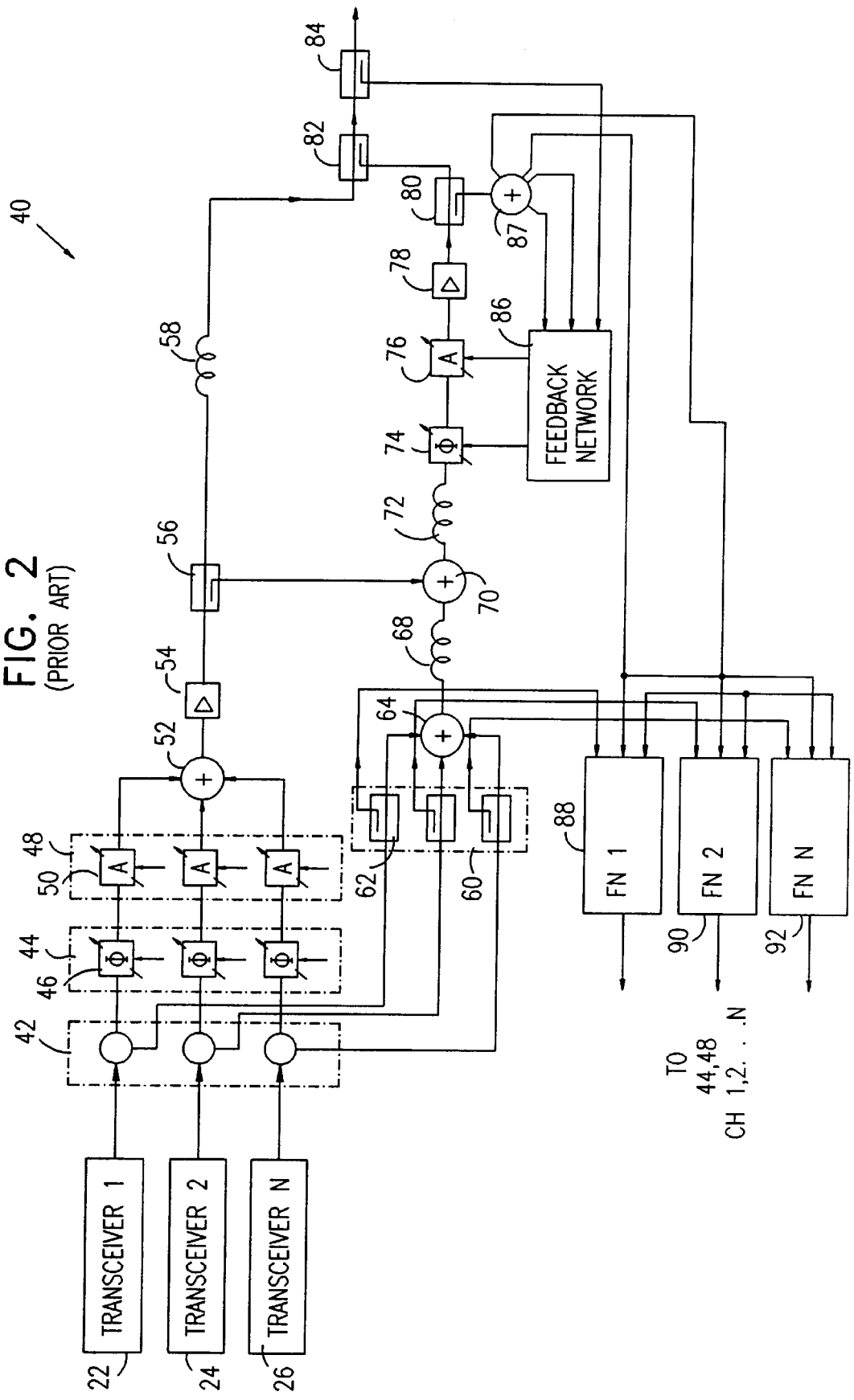
FIG. 2 is a schematic block diagram that illustrates a feedforward amplifier, as is known in the art.
Figure 3:
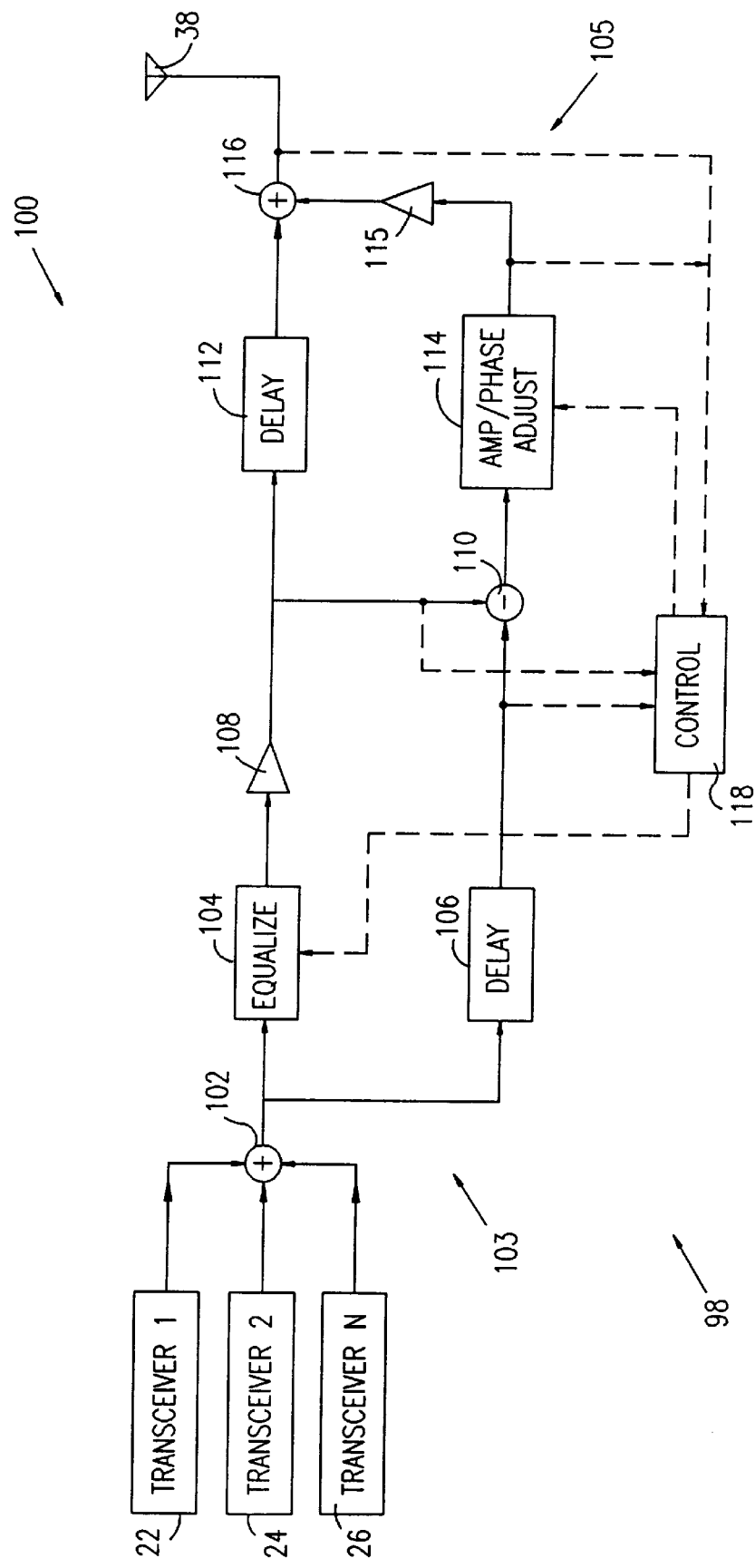
FIG. 3 is a schematic block diagram illustrating a base station transmitter including a feedforward amplifier with digital equalization, in accordance with a preferred embodiment of the present invention.

Reference is now made to FIG. 3, which is a simplified block diagram that schematically illustrates a base station transmitter 98, including a wideband feedforward amplifier 100, in accordance with a preferred embodiment of the present invention. RF inputs from multiple transceivers 22, 24. . . , 26 are summed together by a combiner 102 to generate a multi-carrier input to a signal cancellation loop 103 of the amplifier. Preferably, the RF inputs are in a cellular band in the 800–900 MHz range and cover a total bandwidth of about 25 MHz, but those skilled in the art will appreciate that amplifier 100 can easily be adapted for other frequency bands and bandwidths. Following amplification by a RF power amplifier 108 and linearization of the signals, i.e., suppression of distortion products, the signals are output for transmission via antenna 38.

Loop 103 comprises a digital equalization circuit 104 in an upper arm of the loop and a delay circuit 106 in a lower arm thereof. (The terms "upper" and "lower" arm are used herein for convenience of description, and bear no relation to the physical arrangement or properties of the elements of amplifier 100.) The functions of circuits 104 and 106 are described in greater detail hereinbelow. The equalized signals in the upper arm are input to power amplifier 108. A loop subtractor 110 subtracts the delayed lower-arm signal from the equalized and amplified upper-arm signal to generate an error signal for input to an error cancellation loop 105 of amplifier 100. Preferably, the error signal contains substantially only distortion components, resulting from inter-modulation products of the carriers and other spurious signals. As described further hereinbelow, the effect of equalization circuit 104 is such that the desired signal portions (i.e., the portions not due to distortion) of the upper- and lower-arm signals that are input to subtractor 110 are substantially equal.

Loop 105 comprises an amplitude and phase adjustment circuit 114, which adjusts the amplitude and phase of the error signal, as well as the delay of the error signal relative to the amplified output signal from power amplifier 108. The output of the power amplifier is delayed by a delay circuit 112. The error signal from circuit 114 is then amplified by an error amplifier 115 and subtracted from the power amplifier output by a directional coupler 116 to generate the linearized RF output for transmission via antenna 38. The output may be coupled directly to the antenna, or via a duplexer, as is known in the art.

A control circuit 118, preferably based on a digital signal processor (DSP), as described further hereinbelow, samples the amplified RF signal at the output of power amplifier 108 and the delayed input signal at the output of delay circuit 106. Based on the sampled signals, control circuit 118 calculates and outputs equalization coefficients for use in equalization circuit 104. Preferably, the coefficients correspond to a vector with which the signals are convolved, or filtered, in circuit 104 so as to pre-distort the input to power amplifier 108, thereby compensating for linear distortion introduced by the power amplifier and other elements in the circuitry of amplifier 100. By effectively removing the linear distortion, signal cancellation loop 103 achieves superior cancellation of the signal carriers over substantially the entire transmission bandwidth.

Preferably, control circuit 118 performs other functions and controls other elements of amplifier 100 in both signal cancellation loop 103 and error cancellation loop 105. Further preferably, circuit 118 receives and operates on other inputs from different points in the circuitry of amplifier 100, such as points in the error cancellation loop.

Figure 4:
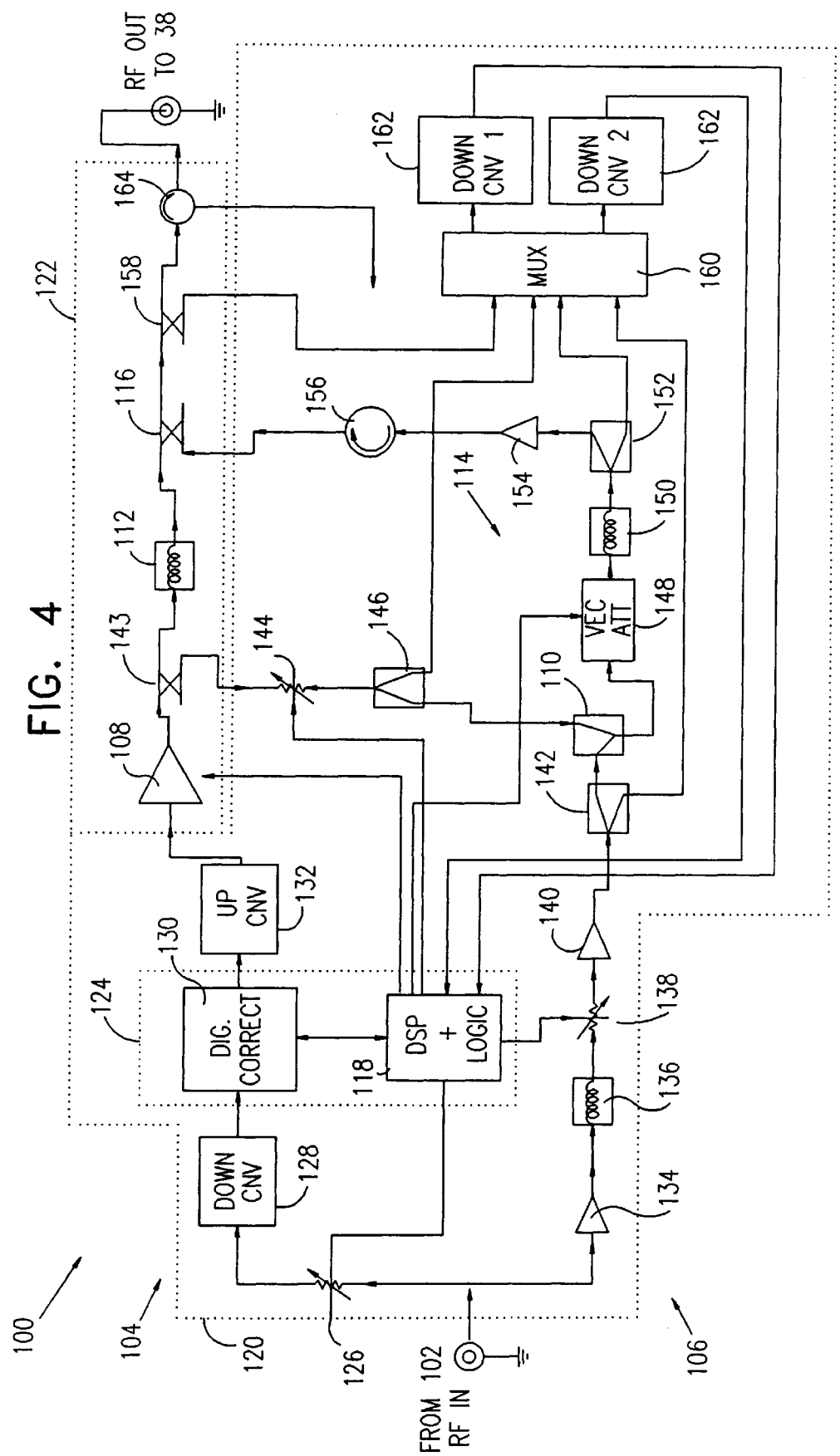
FIG. 4 is a schematic block diagram showing details of the circuitry of the feedforward amplifier of FIG. 3, in accordance with a preferred embodiment of the present invention.

FIG. 4 is a schematic block diagram showing details of feedforward amplifier 100, in accordance with a preferred embodiment of the present invention. Amplifier 100 preferably comprises three major functional blocks: an RF processing block 120, an RF power block 122 and a digital processing block 124. It will be understood that the amplifier also includes auxiliary circuitry, such as power supplies, microcontroller circuitry, clock and timing circuits and control lines, preferably linked to digital block 124, which are not shown in the figure for the sake of clarity, but whose design and use will be clear to those skilled in the art.

Equalization circuit 104 comprises a down-converter 128, which converts RF signals that are input from combiner 102 to an intermediate frequency (IF) of about 40 MHz. Prior to down-conversion, the level of the input signals is preferably adjusted by a variable attenuator 126 so as to ensure that the signal is properly scaled for sampling. The IF signals are input to a digital correction circuit 130, which performs the equalization, together with filtering, interpolation and digital up-conversion, as described further hereinbelow. DSP and logic circuits 118, preferably comprising a SHARC floating point processor (for example, model 21061, produced by Analog Devices, Inc., Norwood, Mass.), control the operation of circuit 130, as well as setting the level of attenuator 126 and controlling other circuit functions in amplifier 100. An up-converter 132 converts the corrected IF output signals from circuit 130 back to the original RF input frequency and passes the equalized RF signals to power amplifier 108.

A portion of the output of power amplifier 108 is sampled by a directional coupler 143, and is passed via a variable attenuator 144 and a splitter 146, to loop subtractor 110. In the lower arm of signal cancellation loop 103, delay circuit 106 comprises a delay line 136, along with an input amplifier 134 and an output amplifier 140. A variable attenuator 138 adjusts the signal amplitude, under the control of DSP and logic circuits 118. Delay line 136 preferably comprises a surface acoustic wave (SAW) delay line, as is known in the art, such as those produced by Andersen Labs of Bloomfield, Conn., or by Sawtek, Inc., of Orlando, Fla. Delay line 136 matches the absolute signal delays of the upper and lower arms. Attenuators 138 and 144 are set so as to provide full cancellation of the input signal components from the upper and lower arms of loop 103 at subtractor 110, leaving substantially only the error component to be input to amplitude/phase adjustment circuit 114 in error cancellation loop 105.

Circuit 114 comprises a variable vector attenuator 148 and a delay line 150, which optionally comprises a variable delay line, both preferably controlled by DSP and logic. The vector attenuator preferably comprises an integrated device, such as a VM-A01S device, produced by KDI/Triangle Corp., of Whippany, N.J., or a 810VA device, produced by Micro-Precision Technologies, Inc., of Salem, N.H. Alternatively, it may be constructed using discrete components, as is well known to those skilled in the art. The vector attenuator controls the amplitude and phase of the RF error signal which passes through it, and is controlled by the DSP using a pair of digital to analog converters (not shown). An error amplifier 154 amplifies the error signal, which is then passed via an isolator 156 to directional coupler 116. The major part of the output from power amplifier 108, which is not split off by coupler 143, is delayed by delay line 112, and is then combined with the amplified error signal at coupler 116, whereby the error component is subtracted out.

The RF output of RF power block 122 to antenna 38 thus comprises the multi-channel signal at the plurality of carrier frequencies, substantially without inter-channel interference. The output is fed to the antenna via an output isolator 164, which isolates main amplifier 108 and other RF circuitry from power reflected back from the antenna or from other external devices. The output isolator preferably includes a reverse power indication (illustrated by the arrow coming out of the isolator down and leftwards), which is used to generate an alarm in the case of excessive reverse power.

As noted hereinabove, DSP and logic circuits 118 set various circuit parameters and coefficients in amplifier 100, preferably including:

Coefficients of digital correction circuit 130;

Gains of attenuators 126, 138, and 144; and

Control voltages for vector attenuator 148.

Those skilled in the art will appreciate other uses to which the DSP and logic circuits can be put. Preferably, the DSP alternates among the different control tasks, so as to alternately set parameters in signal cancellation loop 103 and error cancellation loop 105, for example.

As a basis for setting the parameters and coefficients, the DSP receives, digitizes and processes signals sampled from various points in the circuitry of amplifier 100, as noted above. Splitters 146 and 142 respectively provide portions of the output signals from power amplifier 108 and of delay circuit 106, which signals are used by the DSP primarily in setting the digital correction coefficients and other parameters in loop 103. A splitter 152 and a directional coupler 158 respectively provide portions of the adjusted error signal from circuit 114 and of the amplified signal for output to antenna 38, for use mainly in controlling loop 105. The signal portions are input to a multiplexer 160, which preferably selects two of the signals for down-conversion to IF by first and second down-converters 162. The selected IF signals are received and digitized by DSP and logic circuits 118, preferably at a sampling frequency in the range of 50–70 MHz, and are then used by the DSP in calculating the parameters and coefficients mentioned above.

Figure 5:
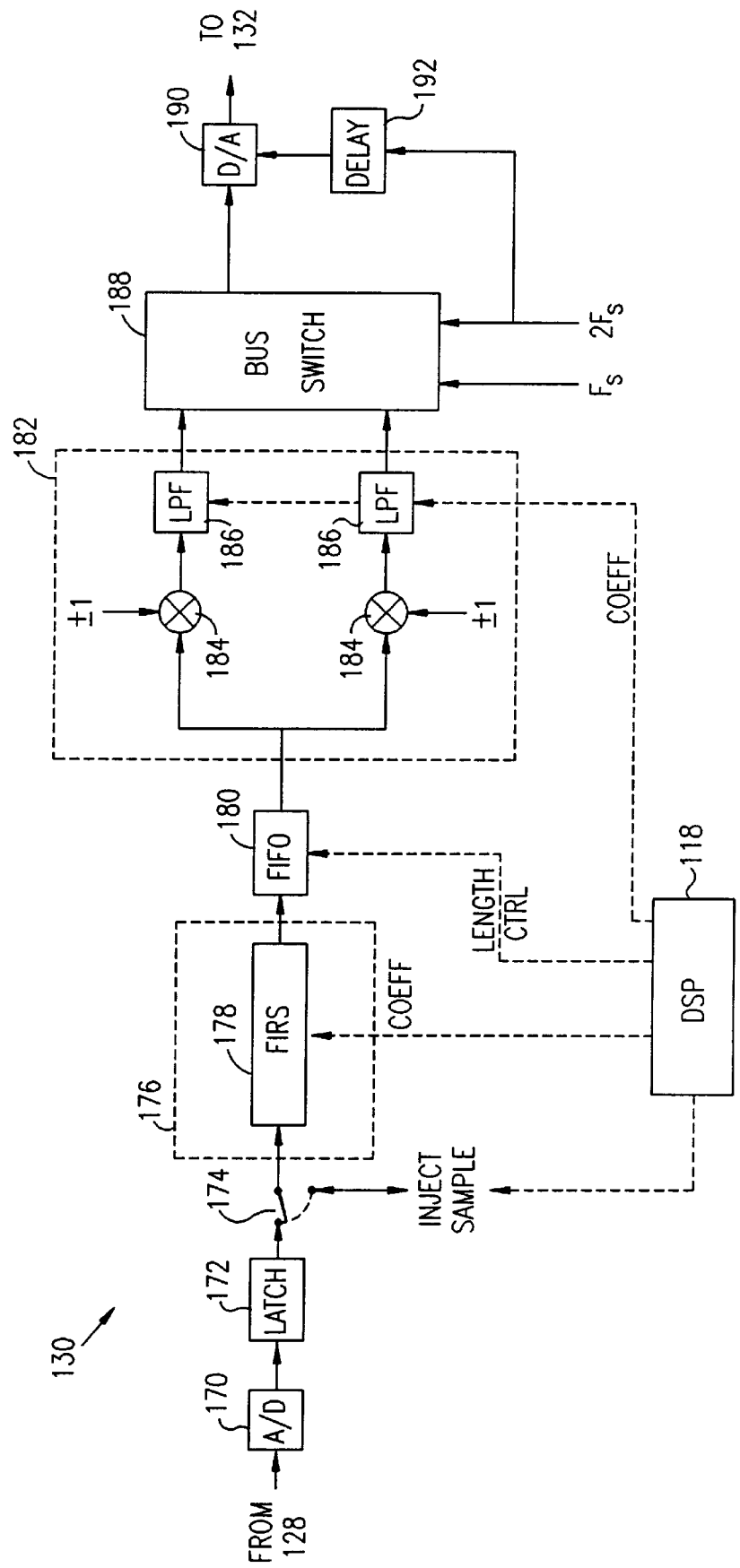
FIG. 5 is a schematic block diagram showing details of digital equalization circuitry in the feedforward amplifier of FIG. 3, in accordance with a preferred embodiment of the present invention.

FIG. 5 is a schematic block diagram showing details of digital correction circuit 130, in accordance with a preferred embodiment of the present invention. IF signals from down-converter 128 are digitized, preferably by a high-speed 12-bit A/D converter 170, such as a CLC5956, produced by National Semiconductor Corp. of Arlington, Tex., or an AD6640 converter, produced by Analog Devices. A/D converter 170 preferably operates at the same basic sampling clock rate as is used in the digitization of the feedback signals described above. The output of the A/D converter is held by a 12-bit latch 172 and is then input via a bus-connection switch 174 to a digital equalizer 176. Although switch 174 is normally set to convey digitized signals from the latch to the equalizer, it can be shifted to enable DSP 118 to receive samples of the input to equalizer 176 from A/D converter 170 or to inject test signals into the equalizer, typically for calibration and testing of amplifier 100.

Equalizer 176 preferably comprises two finite impulse response (FIR) filters 178, most preferably GC2011 filters produced by Graychip, Inc., Palo Alto, Calif., each comprising a 32-tap pipeline. A sequence of input samples, at the basic sampling rate, is input to the filters. At each of the taps, one of the samples is multiplied by a respective coefficient, loaded into equalizer 176 by DSP 118. The coefficients are calculated and set by the DSP so as to correct for linear distortion in the circuits of amplifier 100. A preferred method for calculating the coefficients is described further hereinbelow.

Following equalization, the samples are passed to a variable-length FIFO 180, which preferably holds up to 64 samples. The length of the FIFO is preset by DSP 118 so that the upper and lower arms of loop 103 have precisely equal throughput delays. Digital upconversion and interpolation are performed using an input stage 182 and a bus switch 188, to provide a high sample-rate digital signal for conversion to analog form. This process effectively increases the frequency of the digital signals before they are input to a D/A converter (DAC) 190, preferably an AD9754 converter, produced by Analog Devices, returns the signals to IF analog form for input to up-converter 132.

Input stage 182 comprises a pair of multipliers 184, which multiply the input samples alternately by +1 and −1, switching between the alternate multiplicands at the above-mentioned sample rate. The two multipliers do not switch simultaneously between the positive and negative values, but rather with a relative 90° phase shift therebetween, so that the stream of pairs of samples has the form of a stream of complex values. The pairs of samples are input to a pair of low-pass filters 186, preferably using Graychip, Inc., GC2011 devices, as described hereinabove, having 32 taps each. The filter coefficients are loaded by DSP 118. The combined pair of filters realize a 64 tap interpolation filter, at a sampling rate that is double the basic rate.

Bus switch 188 preferably comprises a FPGA, most preferably of the type produced by Altera Corporation, of San Jose, Calif. Switch 188 receives inputs from low-pass filters 186 at the basic input sample rate. The samples are clocked out of switch 188 at the double rate. The double-rate clock signal is passed through a delay line 192, which adjusts the phase of the clock signal, to serve as the sample clock for DAC 190. Digital correction block 130 thus has an effective output sample rate which is twice the input sample rate from A/D converter 170. Since the full bandwidth of the RF signals input via combiner 102 is typically 25 MHz, as noted above, there is no danger of loss of information in the digital equalization process.

Figure 6:
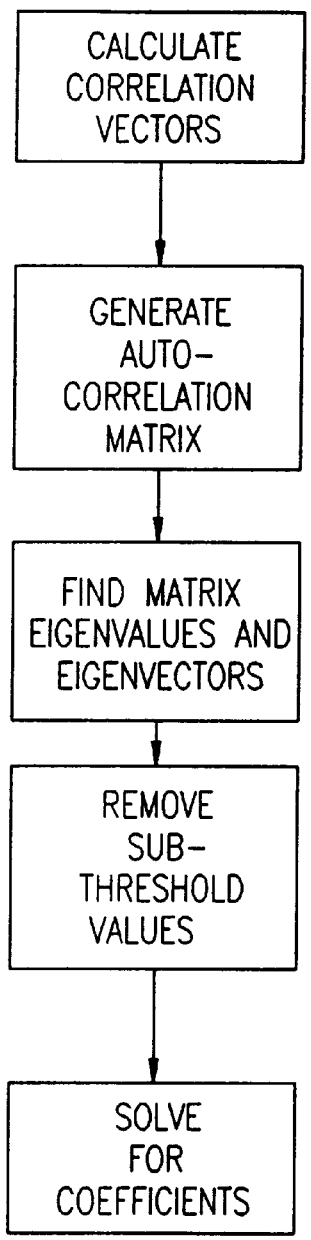
FIG. 6 is a flow chart that schematically illustrates a method for determining equalization coefficients, for use in the equalization circuitry of FIG. 5, in accordance with a preferred embodiment of the present invention.

FIG. 6 is a flow chart that schematically illustrates a method for calculating the coefficients to be loaded into FIRs 178 by DSP 118, in accordance with a preferred embodiment of the present invention. The coefficients are determined so as to provide the best linear estimate of the transfer function between the signals in the upper and lower arms of signal cancellation loop 103, as provided by splitters 146 and 142, respectively. The calculation is based on vectors $\vec{r}$ and $\vec{g}$, which are defined respectively as the auto-correlation of the upper-arm signal (from splitter 146) and the cross-correlation of the upper- and lower-arm signals (from splitters 146 and 142). The auto- and cross-correlations are calculated to order L, wherein L is the total number of FIR taps in equalizer 176. In other words, vectors of samples are shifted by up to ±(L−1) samples relative to one another and are then multiplied entry-by-entry and summed to get each of the entries in the auto- and cross-correlation vectors. The correlation calculations are preferably repeated over an interval of several thousand signal samples.

Vector $\vec{r}$ is used to generate a matrix R, defined as the estimated Toeplitz auto-correlation matrix of the upper-arm signal. R is a symmetric Toeplitz matrix, whose first row and column are the elements of vector $\vec{r}$, $r_0$, $r_1$, $r_2$, . . . :

$$R = \begin{bmatrix} r_0 & r_1 & r_2 & \ldots \\ r_1 & r_0 & r_1 & \ldots \\ r_2 & r_1 & r_0 & \ldots \\ \ldots & \ldots & \ldots & \ldots \end{bmatrix}$$

It is noted that a Toeplitz matrix is completely defined by its first row and column, since by definition the elements along any of its diagonals are equal. Next, the eigenvalues and corresponding eigenvectors of matrix R are calculated. Methods of determining the eigenvalues and eigenvectors of a matrix are well known in the art of linear algebra. Preferably, the calculation is performed by first converting matrix R to a tri-diagonal matrix, using a set of matrix multiplications, and then iteratively finding a diagonal matrix $\Lambda$, wherein $\Lambda = \text{diag}(\lambda_0, \lambda_1, \ldots, \lambda_{L-1})$, and $\lambda_0$, $\lambda_1$, . . ., $\lambda_{L-1}$ are the eigenvalues of the tri-diagonal matrix. These procedures are preferably carried out using the TRED2 and TQL2 algorithms, respectively, following the notation of the standard EISPACK package, as described, for example, by Smith, et al., in "*Matrix Eigensystem Routines - EISPACK Guide,*" vol. 6 in *Lecture Notes in Computer Science*, second edition, Springer-Verlag (1976), and incorporated herein by reference. Source code for the TRED2 and TQL2 routines is listed in an Appendix to this patent application.

Derivation of the required equalizer coefficients involves calculating the inverse of matrix R. It is well known that this inverse and its calculation may be numerically unstable when the dynamic range of the eigenvalues of the matrix is too large. The dynamic range is defined as the ratio between the absolute values of the largest and smallest eigenvalue. Therefore, in order to eliminate the unstable effects of large spreads in the set of eigenvalues, those values that are smaller than a given threshold are eliminated. Formally, each eigenvalue $\lambda_i$ is assigned an inverse value $\underline{\lambda}_i$, as follows:

$$\underline{\lambda}_i = \begin{cases} 1/\lambda_i & \lambda_i > Th \\ 0 & \text{otherwise} \end{cases}$$

wherein $$Th = \max(\lambda_i) \cdot 10^{-T/20}.$$

Preferably, T is set to a value of approximately 50, which is equivalent to eliminating eigenvalues that are at least 50 dB down from the maximum.

Based on the inverse eigenvalues, a new diagonal matrix is defined:

$$\underline{\lambda} = \text{diag}(\underline{\lambda}_0, \underline{\lambda}_1, \ldots, \underline{\lambda}_{L-1})$$

The vector of FIR coefficients for equalizer 176 is given by:

$$\vec{B} = Q \underline{\lambda} Q^T \cdot \vec{g}$$

wherein Q is a matrix whose columns are the eigenvectors of matrix R. Calculation of vectors $\vec{r}$ and $\vec{g}$ can be performed in a batch process, from time to time, but is preferably updated iteratively while amplifier 100 is operating. The first step in iterative determination of the equalization coefficients is to calculate an initial estimate of the vectors. A certain time slot duration is defined, and the coefficients are recalculated after each time slot using iterated values of $\vec{r}$ and $\vec{g}$. If the nature of the input signals has not changed substantially since the preceding time slot, the iterated values of the vectors are calculated by averaging in the correlations of the signals in the current time slot with the old values. If there has been a substantial change, however, a new initial estimate of $\vec{r}$ and $\vec{g}$ is made, and the coefficients are recalculated.

A preferred method for determining whether the signals have changed substantially is for DSP 118 to calculate an average power of a difference taken between the upper- and lower-arm signals (from splitters 146 and 142). If the power is above a predetermined threshold, a new initial calculation of $\vec{r}$ and $\vec{g}$ is made.

Figure 7:
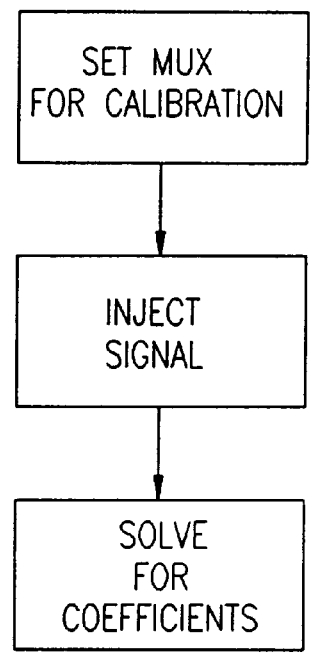
FIG. 7 is a flow chart that schematically illustrates a method for calibrating control signal inputs in the feedforward amplifier of FIGS. 3–5, in accordance with a preferred embodiment of the present invention.

FIG. 7 is a flow chart that schematically illustrates a method for calibrating the upper- and lower-arm inputs to DSP 118, in accordance with a preferred embodiment of the present invention. Such calibration is necessary if the DSP is to accurately generate optimal coefficients for equalizer 176.

To perform the calibration, multiplexer 160 is switched so that both down-converters 162 receive a common signal, preferably from splitter 146. Bus-connection switch 174 is positioned to enable a digital test signal to be injected into equalizer 176. The test signal is then received at the DSP and logic circuits via both down-converters simultaneously. Therefore, any differences in the received signals must be due to differences in the respective transfer functions.

Using essentially the same algorithm as described above, equalizer calibration coefficients are determined, corresponding to the difference in the transfer functions. During normal operation, whenever the DSP is to calculate the coefficients for loading into equalizer 176, the signals received by DSP 118 from splitter 142, which are passed to the DSP via the second down-converter 162, are first filtered using the calibration coefficients. The filtered signal values are then used in calculating $\vec{g}$.

In the preferred embodiment described hereinabove, a novel method of signal equalization has been disclosed for use in linearization of RF amplifier 100. Although FIG. 5 illustrates a certain design of digital correction circuit 130, and particularly of equalizer 176, it will be appreciated that the methods described hereinabove may also be applied to find equalization coefficients for use in different, digital or analog, hardware configurations. Similarly, DSP 118 may calculate equalization coefficients using frequency-domain analysis of the signals, rather than the correlation-based method described hereinabove. Those skilled in the art will further understand that other methods of equalization, as are known in the art, may similarly be adapted for use in linearization of feedforward amplifiers, in accordance with the principles of the present invention. For example, whereas equalizer 176 processes the signals in the time domain, digital frequency-domain equalization could similarly be used.

Furthermore, although in the preferred embodiment described above, digital correction block 130 and associated down-converter 128 and up-converter 132 process the signals in the upper arm of loop 103, for input to power amplifier 108, it will be understood that a similar digital correction block, mutatis mutandis, may be positioned and configured elsewhere in the amplifier circuitry. For example, down-converter 128, digital correction block 130 and up-converter 132 may be placed in the lower arm of signal cancellation loop 103, so as to pre-distort the cancellation signal before subtraction from the amplified signal at subtractor 110. Similar equalization schemes may be employed to perform equalization of error-cancellation loop 105 of the amplifier.

Alternatively, digital equalization of the signals may take place in baseband processing circuitry (not shown in the figures), so as to generate a suitably equalized baseband signal. This baseband signal is then converted to analog form and up-converted to RF for input to either the upper or lower arm of signal cancellation loop 103 (while the other arm receives the input signal without equalization). All such alternative embodiments are considered to be within the scope of the present invention.

It will thus be appreciated that the preferred embodiments described above are cited by way of example, and the full scope of the invention is limited only by the claims.

APPENDIX

The following listing comprises FORTRAN source code for carrying out the TRED2 and TQL2 algorithms, used in tri-diagonalizing and finding the eigenvalues and eigenvectors of the Toeplitz autocorrelation matrix R, as described hereinabove. These algorithms, which are in the public domain, are incorporated herein in their entirety. The listing and notes on the source code are described by Smith, et al., in *"Matrix Eigensystem Routines-EISPACK Guide,"* vol. 6 in *Lecture Notes in Computer Science*, second edition, Springer-Verlag (1976), which is incorporated herein by reference.

```
=========================================================
* NIST Guide to Available Math Software.
* Source for module TRED2 from package EISPACK.
=========================================================
      subroutine tred2 (nm,n,a,d,e, z)
c
         integer i,j,k,i,n,ii,nm,jpi
         double precision a(nm,n) ,d(n) ,e(n) ,z (nm,n)
c        double precision f,g,h,hh,scale
c        this subroutine is a translation of the algol
c        procedure tred2,
c        num. math. 11, 181-195(1968) by martin, reinsch,
c        and wilkinson.
c        handbook for auto. comp.; vol.ii-linear algebra,
c        212-226(1971)
c
c        this subroutine reduces a real symmetric matrix to
a
c        symmetric tridiagonal matrix using and accumulating
c        orthogonal similarity transformations.
c
c        on input
c
c           nm must be set to the row dimension of
c           two-dimensional
c              array parameters as declared in the calling
c              program
c              dimension statement.
c
c           n is the order of the matrix.
c
c           a contains the real symmetric input matrix.
c           only the
c              lower triangle of the matrix need be supplied.
c
c        on output
c
c           d contains the diagonal elements of the
c           tridiagonal matrix.
c
c           e contains the subdiagonal elements of the
c           tridiagonal
c              matrix in its last n - 1 positions. e(1) is set
c              to zero.
c
c           z contains the orthogonal transformation matrix
c              produced in the reduction.
c
c           a and z may coincide. if distinct, a is
c           unaltered.
c
c        questions and comments should be directed to burton
c        s. garbow,
c        mathematics and computer science div, argonne
c        national laboratory
c
c        this version dated august 1983.
```

-continued

```
c
c
c-----------------------------------------------------
c
      do 100 i = 1, n
c
         do 80 j = i, n
  80     z(j,i) = a(j,i)
c
         d(i) = a(n,i)
 100  continue
c
      if (n .eq. 1) go to 510
c     ..........for i = n step -1 until 2 do -- ..........
         do 300 ii = 2, n
            i = n + 2 - ii
            l = i - 1
            h = 0.0d0
            scale = 0.0d0
            if (l .lt. 2) go to 130
c     ..........scale row (algol tol then not needed) .
            do 120 k = 1, l
 120        scale = scale + dabs(d(k))
c
            if (scale .ne. 0.0d0) go to 140
 130        e(i) = d(l)
c
            do 135 j = 1, l
               d(j) = z(l,j)
               z(i,j) = 0.0d0
               z(j,i) = 0.0d0
 135        continue
c
            go to 290
c
 140     do 150 k = 1, l
            d(k) = d(k)/scale
            h = h + d(k) * d(k)
 150     continue
c
         f = d(l)
         g = -dsign(dsqrt(h),f)
         e(i) = scale * g
         h = h - f * g
         d(l) = f - g
c     ..........form a*u ..........
         do 170 j = 1, l
 170     e(j) = 0.0d0
c
         do 240 j = 1, l
            f = d(j)
            z(j,i) = f
            g = e(j) + z(j,j) * f
            jp1 = j + 1
            if (l .lt. jp1) go to 220
c
            do 200 k = jp1, l
               g = g + z(k,j) * d(k)
               e(k) = e(k) + z(k,j) * f
 200        continue
c
 220        e(j) = g
 240     continue
c     ..........form p ..........
         f = 0.0d0
c
         do 245 j = 1, l
            e(j) = e(j)/h
            f = f + e(j) * d(j)
 245     continue
c
         hh = f/(h + h)
c     .......... form q ..........
         do 250 j = 1, l
 250     e(j) = e(j) - hh * d(j)
c     .......... form reduced a ..........
         do 280 j = 1, l
            f = d(j)
            g = e(j)
```

```
c
          do 260 k = j, 1
 260   z(k,j) = z(k,j) - f * e(k) - g * d(k)
c
          d(j) = z(1,j)
          z(i,j) = 0.0d0
 280   continue
c
 290   d(i) = h
 300   continue
c    .......... accumulation of transformation matrices
       do 500 i = 2, n
          1 = i - 1
          z(n,1) = z(1,1)
          z(1,1) = 1.0d0
          h = d(i)
          if (h .eq. 0.0d0) go to 380
c
          do 330 k = 1, 1
 330   d(k) = z(k,i)/h
c
          do 360 j = 1, 1
             g = 0.0d0
c
          do 340 k = 1, 1
 340   g = g + z(k,i) * z(k,j)
c
          do 360 k = 1, 1
             z(k,j) = z(k,j) - g * d(k)
 360   continue
c
 380   do 400 k = 1, 1
 400   z(k,i) = 0.0d0
c
 500   continue
c
 510   do 520 i = 1, n
          d(i) = z(n,i)
          z(n,i) = 0.0d0
 520   continue
c
       z(n,n) = 1.0d0
       e(1) = 0.0d0
       return
       end
subroutine tq12 (nm, n, d, e, z, ierr)
c
       integer i,j,k,l,m,n,ii,11,12,nm,rnmi,ierr
       double precision d(n) ,e(n) ,z(nm,n)
       double precision c,c2,c3,dl1,el1,
          f,g,h,p,r,s,s2,tst1,tst2,pythag
c
c    this subroutine is a translation of the algol
c    procedure tq12,
c    num. math. 11, 293-306(1968) by bowdler, martin,
c    reinsch, and
c    wilkinson.
c    handbook for auto. comp., vol.ii-linear algebra,
c    227-240(1971).
c
c    this subroutine finds the eigenvalues and
c    eigenvectors
c    of a symmetric tridiagonal matrix by the ql method.
c    the eigenvectors of a full symmetric matrix can
c    also
c    be found if tred2 has been used to reduce this
c    full matrix to tridiagonal form.
c
c    on input
c
c      nm must be set to the row dimension of
c      two-dimensional
c         array parameters as declared in the calling
c         program
c         dimension statement.
c
c      n is the order of the matrix.
c
c      d contains the diagonal elements of the input
```

```
c       matrix.
c
c       e contains the subdiagonal elements of the input
c       matrix
c         in its last n - 1 positions. e(1) is arbitrary.
c
c       z contains the transformation matrix produced in
c       the
c         reduction by tred2, if performed. if the
c         eigenvectors
c         of the tridiagonal matrix are desired, z must
c         contain
c         the identity matrix.
c
c   on output
c
c       d contains the eigenvalues in ascending order.
c       if an
c         error exit is made, the eigenvalues are
c         correct but
c         unordered for indices 1,2, . . . ,ierr-1.
c
c       e has been destroyed.
c
c       z contains orthonormal eigenvectors of the
c       symmetric
c         tridiagonal (or full) matrix. if an error
c         exit is made,
c         z contains the eigenvectors associated with
c         the stored
c         eigenvalues.
c
c       ierr is set to
c         zero   for normal return,
c         j      if the j-th eigenvalue has not been
c                  determined after 30 iterations.
c
c   calls pythag for dsqrt(a*a + b*b)
c
c   questions and comments should be directed to burton
c   s. garbow,
c   mathematics and computer science div, argonne
c   national laboratory
c
c   this version dated august 1983.
c
c
c   ---------------------------------------------------------
c
      ierr = 0
      if (n .eq. 1) go to 1001
c
      do 100 i = 2, n
 100  e(i - 1) = e(i)
c
      f = 0.0d0
      tst1 = 0.0d0
      e(n) = 0.0d0
c
      do 240 1 = 1, n
         j = 0
         h = dabs(d(1)) + dabs(e(1))
         if (tst1 .lt. h) tst1 = h
c     .......... look for small sub-diagonal element ...
         do 110 m = 1, n
            tst2 = tst1 + dabs(e(m))
            if (tst2 .eq. tst1) go to 120
c     .......... e(n) is always zero, so there is no exit
c                through the bottom of the loop ........
 110     continue
c
 120     if (m .eq. 1) go to 220
 130     if (j .eq. 30) go to 1000
         j = j + 1
c     .......... form shift ..........
         l1 = 1 + 1
         l2 = l1 + 1
         g = d(1)
         p = (d(11) - g)/(2.0d0 * e(1))
```

-continued

```
       r = pythag(p,1.0d0)
       d(1) = e(1)/(p + dsign(r,p))
       d(l1) = e(1) * (p + dsign(r,p))
       dl1 = d(l1)
       h = g − d(1)
       if (l2 .gt. n) go to 145
c
       do 140 i = l2, n
 140   d(i) = d(i) − h
c
 145   f = f + h
c      ......... ql transformation .........
       p = d(m)
       c = 1.0d0
       c2 = c
       el1 = e(l1)
       s = 0.0d0
       mml = m − 1
c      ......... for i = m − 1 step −1 until 1 do -- ......
       do 200 ii = 1, mml
          c3 = c2
          c2 = c
          s2 = s
          i = m − ii
          g = c * e(i)
          h = c*p
          r = pythag(p,e(i))
          e(i + 1) = s * r
          s = e(i)/r
          c = p/r
          p = c * d(i) − s * g
          d(i + 1) = h + s * (c * g + s * d(i))
c      ......... form vector .........
          do 180 k = 1, n
             h = z(k,i + 1)
             z(k,i + i) = s * z(k,i) + c * h
             z(k,i) = c * z(k,i) − s * h
 180      continue
c
 200   continue
c
       p = −3 * s2 * c3 * el1 * e(1)/dl1
       e(1) = s * p
       d(i) = c * p
       t3t2 = tst1 + dabs(e(1))
       if (tst2 .gt. tst1) go to 130
 220   d(1) = d(1) + f35
 240   continue
c      ......... order eigenvalues and eigenvectors ....
       do 300 ii = 2, n
          i = ii − 1
          k = i
          p = d(i)
c
          do 260 j = ii, n
             if (d(j) *ge. p) go to 260
             k = j
             p = d(j)
 260      continue
c
          if (k .eg. i) go to 300
          d(k) = d(i)
          d(i) = p
c
          do 280 j = 1, n
             p = z(j,i)
             z(j,i) = z(j,k)
             z(j,k) = p
 280      continue
c
 300   continue
c
       go to 1001
c      ......... set error -- no convergence to an
c                      eigenvalue after 30 iterations ........
 1000  ierr = 1
 1001  return
       end
```

What is claimed is:

1. A super-linear feedforward amplifier, for amplifying radio-frequency input signals produced in one or more frequency channels over an input band, comprising:
   a radio-frequency power amplifier, which amplifies the signals;
   a signal cancellation circuit loop, which generates an error signal responsive to distortion products in the amplified signals;
   a digital correction block, which digitally equalizes a digitized version of the input signals responsive to a transfer function of the amplifier, whereby the input signals are substantially canceled out of the error signal over the entire input band; and
   an error cancellation circuit loop, which subtracts the error signal from the amplified signals to generate a linearized output signal.

2. An amplifier according to claim 1, wherein the digital correction block equalizes an amplitude and phase response of the amplifier over substantially the entire input band.

3. An amplifier according to claim 1, wherein the input signals comprise a plurality of signals in different, respective channels, which are summed together for input to the amplifier.

4. An amplifier according to claim 1, wherein the digital correction block corrects linear distortions in the amplified signals.

5. An amplifier according to claim 1, wherein the digital correction block receives feedback signals sampled at one or more points in at least one of the signal and error cancellation loops and processes the feedback signals to determine characteristics of the transfer function.

6. An amplifier according to claim 5, wherein the digital correction block comprises a digital signal processor, which calculates a correlation of the feedback signals and determines the characteristics of the transfer function based on the correlation.

7. An amplifier according to claim 6, wherein the digital signal processor finds eigenvalues and eigenvectors of a matrix based on the correlation, and applies the eigenvalues to generate processing coefficients for use in equalizing the signals.

8. An amplifier according to claim 6, wherein the digital correction block comprises circuitry that receives and digitizes the feedback signals, the receiver having a transfer function, and wherein the digital signal processor calibrates the circuitry responsive to the transfer function thereof before receiving and processing the feedback signals.

9. An amplifier according to claim 5, wherein the feedback signals comprise samples of the amplified signal output by the power amplifier and of a delayed input signal in the signal cancellation loop.

10. An amplifier according to claim 5, wherein the digital correction block adaptively controls operation of the amplifier substantially without passing a pilot signal therethrough.

11. An amplifier according to claim 1, and comprising a down-converter, which converts the input signals from the radio frequency to an intermediate frequency for input to the digital correction block, and an up-converter, which converts the equalized signals to the radio frequency for amplification thereof.

12. An amplifier according to claim 11, wherein the equalized signals from the up-converter are input to the power amplifier.

13. A super-linear feedforward amplifier, for amplifying radio-frequency input signals produced in one or more frequency channels over an input band, comprising:
   a radio-frequency power amplifier, which amplifies the signals;
   a signal cancellation circuit loop, which generates an error signal responsive to distortion products in the amplified signals;
   a time-domain correction block, which processes successive sample of the input signals in the time domain, responsive to a transfer function of the amplifier, such that the input signals are substantially canceled out of the error signal over the entire input band; and
   an error cancellation circuit loop, which subtracts the error signal from the amplified signals to generate a linearized output signal.

14. An amplifier according to claim 13, wherein the time-domain correction block equalizes the input signals responsive to the transfer function.

15. An amplifier according to claim 13, wherein the time-domain correction block comprises:
   an analog-to-digital converter, which digitizes the input signals to generate a stream of digital samples;
   a finite impulse response filter, which convolves the digital samples with a vector of coefficients determined responsive to the transfer function; and
   a digital-to-analog converter, which converts the equalized signals to analog form for output from the block.

16. A method for feedforward amplification of radio frequency signals input from one or more predefined frequency channels over an input band, comprising:
   providing a power amplifier and associated circuitry having an amplitude and phase transfer function;
   determining a characteristic of the transfer function of the amplifier and the associated circuitry;
   digitizing the input signals to generate a stream of digital samples;
   processing the digital samples to equalize the signals responsive to the characteristic;
   converting the equalized signals to analog form;
   amplifying the signals using the amplifier;
   generating an error signal responsive to distortion in the equalized and amplified signals; and
   subtracting the error signal from the amplified signals to generate a linearized output signal in which the distortion is reduced.

17. A method according to claim 16, wherein equalizing the signals comprises equalizing an amplitude and phase response of the amplifier over substantially the entire input band.

18. A method according to claim 16, and comprising summing a plurality of signals in different, respective channels for input to the amplifier.

19. A method according to claim 16, wherein equalizing the signals comprises processing the input signals to compensate for linear distortions in the amplified signals introduced by the power amplifier and associated circuitry.

20. A method according to claim 19, wherein amplifying the signals comprises amplifying the processed signals.

21. A method according to claim 16, wherein determining the characteristic comprises receiving and processing feedback signals sampled at one or more points in circuitry associated with the amplifier.

22. A method according to claim 21, wherein processing the feedback signals comprises calculating a correlation of the feedback signals and determining the characteristic of the transfer function based on the correlation.

23. A method according to claim 22, wherein processing the feedback signals comprises finding eigenvalues and eigenvectors of a matrix based on a vector indicative of the correlation and generating processing coefficients for use in equalizing the signals based on the eigenvalues and eigenvectors.

24. A method according to claim 23, wherein equalizing the signals comprises convolving the signals with a vector of the processing coefficients.

25. A method according to claim 23, wherein generating the coefficients comprises calculating coefficients dependent on the eigenvalues.

26. A method according to claim 25, wherein calculating the coefficients comprises eliminating eigenvalues that are below a predetermined threshold.

27. A method according to claim 22, wherein calculating the correlation comprises:

determining an initial estimate of the correlation based on feedback signals received during a first time slot;

receiving additional feedback signals during a second, subsequent time slot; and iteratively updating the initial estimate of the correlation based on the additional feedback signals.

28. A method according to claim 27, wherein calculating the correlation comprises deriving a signal parameter from the feedback signals and, responsive to a substantial change in the parameter, determining a new estimate of the correlation vector instead of iteratively updating the initial estimate.

29. A method according to claim 21, wherein receiving the feedback signals comprises receiving the signals using circuitry having an amplitude and phase transfer function, and wherein processing the signals comprises calibrating the circuitry to determine calibration coefficients responsive to the transfer function thereof and applying the calibration coefficients to the feedback signals.

30. A method according to claim 21, wherein receiving the feedback signals comprises sampling the amplified signals and sampling the input signals following a delay thereof.

31. A method according to claim 16, and comprising down-converting the input signals from the radio frequency to an intermediate frequency for equalization thereof, and up-converting the equalized signals to the radio frequency.

32. A method according to claim 31, wherein amplifying the signals comprising amplifying the equalized signals following up-conversion thereof.

33. A method according to claim 16, wherein equalizing the signals comprises processing the input signals in the time domain.

34. A method according to claim 16, wherein processing the digital samples comprises convolving the digital samples with a vector of coefficients determined responsive to the transfer function.

35. A method according to claim 16, wherein generating the error signal comprises controlling the circuitry substantially without passing a pilot signal therethrough.

* * * * *